United States Patent [19]

Gleadall

[11] Patent Number: 5,386,346
[45] Date of Patent: Jan. 31, 1995

[54] CIRCUIT CARD ASSEMBLY WITH SHIELDING ASSEMBLY FOR REDUCING EMI EMISSIONS

[75] Inventor: Wilfred L. Gleadall, Leesburg, Va.

[73] Assignee: Hubbell Incorporated, Orange, Conn.

[21] Appl. No.: 262,375

[22] Filed: Jun. 20, 1994

Related U.S. Application Data

[63] Continuation of Ser. No. 68,801, Nov. 12, 1992, abandoned, which is a continuation of Ser. No. 751,192, Aug. 29, 1991, abandoned.

[51] Int. Cl.⁶ .............................................. H05K 9/00
[52] U.S. Cl. ........................... 361/799; 174/35 R; 174/35 MS; 174/51; 361/753; 361/788; 361/800; 361/803; 439/109
[58] Field of Search .......... 174/35 R, 35 GC, 35 MS, 174/51; 307/91; 361/212, 220, 730, 736, 752, 753, 777, 788, 796, 797, 799, 800, 803, 816, 818; 439/61, 62, 108, 109, 607, 609

[56] References Cited

U.S. PATENT DOCUMENTS

| | | | |
|---|---|---|---|
| 3,276,560 | 10/1966 | Wirtz | 197/18 |
| 3,469,015 | 9/1969 | Warren | 174/35 |
| 3,573,558 | 4/1971 | Babcock | 317/101 |
| 3,860,318 | 1/1975 | Reavis, Jr. et al. | 339/99 |
| 3,904,810 | 9/1975 | Kraus | 174/35 |
| 3,917,978 | 11/1975 | Menzel et al. | 361/220 |
| 4,070,557 | 1/1978 | Ostapovitch | 200/51.1 |
| 4,203,148 | 5/1980 | McComas | 361/399 |
| 4,301,494 | 11/1981 | Jordan | 361/415 |
| 4,384,165 | 5/1983 | Loving, Jr. et al. | 174/35 |
| 4,386,388 | 5/1983 | Beun | 361/399 |
| 4,525,802 | 6/1985 | Hackamack | 364/900 |
| 4,567,317 | 1/1986 | Ehrlich et al. | 174/35 |
| 4,631,641 | 12/1986 | Brombal et al. | 361/424 |
| 4,683,550 | 7/1987 | Jindrick et al. | 364/900 |
| 4,694,380 | 9/1987 | Mallory et al. | 361/424 |
| 4,713,633 | 12/1987 | Saito et al. | 333/222 |
| 4,744,006 | 5/1988 | Duffield | 361/413 |
| 4,758,928 | 7/1988 | Wierec et al. | 361/415 |
| 4,762,966 | 8/1988 | Kosanda | 174/35 |
| 4,780,570 | 10/1988 | Chuck | 174/35 |
| 4,791,524 | 12/1988 | Teigen et al. | 361/212 |
| 4,821,145 | 4/1989 | Corfits et al. | 361/383 |
| 4,829,432 | 5/1989 | Hershberger et al. | 361/424 |
| 4,851,609 | 7/1989 | Reddy | 174/35 |
| 4,872,212 | 10/1989 | Roos et al. | 361/424 |
| 4,903,170 | 2/1990 | Finney et al. | 361/424 |
| 4,970,625 | 11/1990 | Belanger et al. | 361/424 |
| 4,991,062 | 2/1991 | Nguyenngoc | 361/424 |
| 5,084,802 | 1/1992 | Nguyenngoc | 361/424 |

FOREIGN PATENT DOCUMENTS

| | | | |
|---|---|---|---|
| 0090539 | 10/1983 | European Pat. Off. | |
| 2844576 | 4/1980 | Germany | 439/61 |
| 3211758 | 10/1983 | Germany | 361/424 |
| 3228393 | 2/1984 | Germany | |
| 3228398 | 2/1984 | Germany | 174/35 R |

(List continued on next page.)

OTHER PUBLICATIONS

M. Hodgetts, "A Shielded Computer Interface Connector", *Fifteenth Annual Connectors and Interconnection Technology Symposium Proceedings*, pp. 113–118 (Nov. 1982).

(List continued on next page.)

*Primary Examiner*—Leo P. Picard
*Assistant Examiner*—Donald A. Sparks
*Attorney, Agent, or Firm*—Jerry M. Presson; John E. Holmes

[57] ABSTRACT

A circuit card assembly adapted to be coupled to a housing for reducing the amount of electromagnetic interference (EMI) escaping from the housing into the environment. The circuit card assembly includes a printed circuit board, an insulative faceplate coupled to the front edge of the printed circuit board, and a shielding assembly. The shielding assembly includes an electrically conductive strip extending along the rear surface of the insulative faceplate, and a grounding path coupled to the printed circuit board and electrically coupled to the conductive strip. The grounding path provides a reliable, solid, positive ground between the conductive strip and the housing upon insertion of the printed circuit board into the housing.

27 Claims, 3 Drawing Sheets

FOREIGN PATENT DOCUMENTS

| | | | |
|---|---|---|---|
| 3231886 | 3/1984 | Germany | 361/796 |
| 2571922 | 4/1986 | Germany | 361/424 |
| 195568 | 4/1989 | Japan . | |
| 0195598 | 4/1989 | Japan | 361/415 |
| 0100398 | 4/1990 | Japan | 361/424 |
| 2100398 | 4/1990 | Japan . | |
| 3-116997 | 5/1991 | Japan | 361/799 |
| 04-15996 | 1/1992 | Japan | 361/800 |
| 4-94191 | 3/1992 | Japan | 361/800 |
| 05-55781 | 3/1993 | Japan | 361/818 |
| 2196798 | 5/1988 | United Kingdom | 174/35 R |
| 2208970 | 4/1989 | United Kingdom | 174/35 R |

OTHER PUBLICATIONS

J. Landis, "Approaches to EMI Control in Digital Data Transmission Stystms", *Fifteenth Annual Connectors and Interconnection Technology Symposium Proceedings,* pp. 355-364 (Nov. 1982).

D. Eaby, "Developing a Metal Shell Circular Plastic Connector", *Fifteenth Annual Connectors and Interconnection Technology Symposium Proceedings* pp. 365-374 (Nov. 1982).

*Guide to Interference Control Using Beryllium Cooper,* Instrument Specialties Co., Inc., Catalog $E^3$-78 (1987).

"EMI/ESD Depletion Strip", *IBM Technical Disclosure Bulletin* vol. 32, No. 3B, pp. 126-127 (Aug. 1989).

Sears and Zemansky, *University Physics,* Fourth Edition, pp. 392-393.

N. Y. Telephone Scheme.

Landis, "Approaches to EMI control in Digital Data Transmission Systems", 5th Annual Connectors and Interconnection Technology Symposium Proceedings, pp. 355-364, Nov. 1-2, 1982.

Eaby, "Developing a Metal Shell Circular Plastic Connector", 5th Annual Connectors and Interconnection Technology Symposium Proceedings, pp. 365-374, Nov. 1-2, 1982.

Hodgetts, "A Shielded Computer Interface Connector" 5th Annual Connectors and Interconnection Technology Symposium Proceedings, pp. 113-118, Nov. 1-2, 1982.

N. Y. Telephone Scheme-1989.

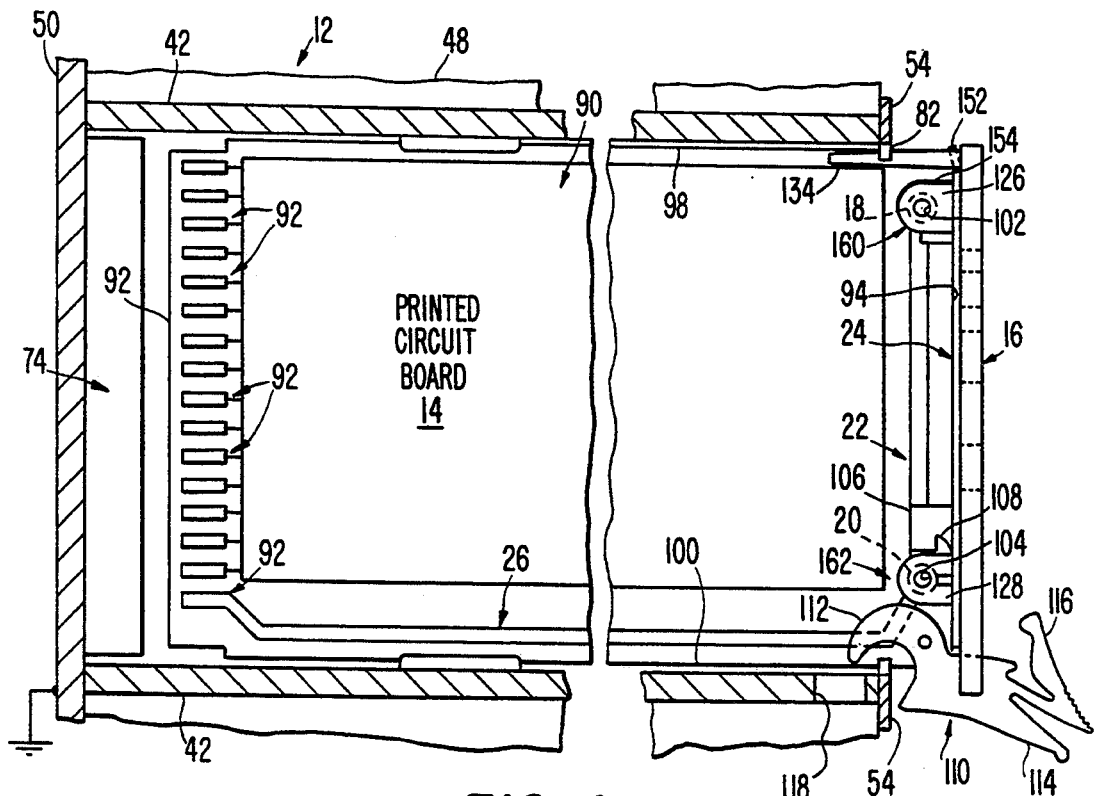
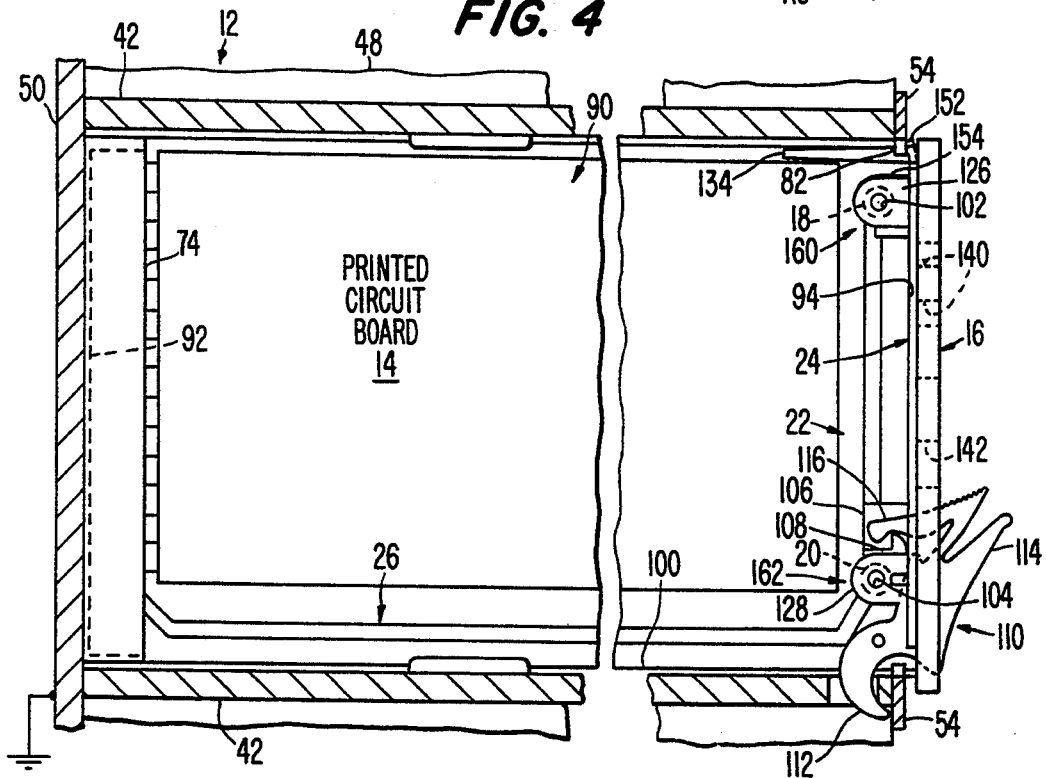

CIRCUIT CARD ASSEMBLY WITH SHIELDING ASSEMBLY FOR REDUCING EMI EMISSIONS

This is a continuation of application Ser. No. 08/068,801 filed Nov. 12, 1992; which is a continuation of application Ser. No. 07/751,192 filed Aug. 29, 1991 now both abandoned.

FIELD OF THE INVENTION

The present invention relates to circuit card assemblies adapted to be inserted into a housing for reducing electromagnetic interference (EMI) emitted by the circuit card into the environment. More specifically, this invention relates to an EMI reducing circuit card assembly having an insulative faceplate with a conductive strip coupled thereto, and an insulative circuit board with a grounding path electrically connecting the conductive strip to a housing upon insertion of the circuit card assembly into the housing.

BACKGROUND OF THE INVENTION

Many of today's electrical systems and equipment generate and emit electromagnetic wave energy during their operation. This emission of electromagnetic wave energy into the environment adversely affects the operation of other electrical or electronic systems, and equipment in the vicinity of the source of the emission. Accordingly, electromagnetic wave energy emitted from electrical or electronic systems and equipment is referred to as electromagnetic interference, or "EMI".

In an attempt to control EMI emissions, the Federal Communications Commission (FCC) has adopted a set of regulations that limit the maximum level of electromagnetic emissions from computing devices. The FCC definition of a computing device is intentionally broad to include electronic equipment used for computing, controlling, recording, storing and transferring information.

Controlling EMI emissions from a system is a complex matter which depends upon many factors. Accordingly, no one single solution exists. In electrical or electronic systems using printed circuit boards, it has been found that the printed circuit boards emit a substantial amount of EMI. Accordingly, there exist a need to develop new cost efficient ways to reduce the amount of EMI emitted by systems or equipment with printed circuit boards to a level below the maximum permissible level set by the FCC.

One example of a prior device for reducing EMI is disclosed in U.S. Pat. No. 4,991,062 to Nguyenngoc, the entire disclosure of which is hereby incorporated herein by reference. The Nguyenngoc device provides a housing with a plurality of printed circuit boards. Each of the printed circuit boards has an insulated faceplate with a metallic clip for shunting the open face of the bay. However, the Nguyenngoc device has the disadvantage, among others, that the clip on the faceplate must contact both the upper and lower designation strips for shunting across the open face of the bay to reduce EMI. Accordingly, the clip of Nguyenngoc may become permanently deformed after many insertions and withdrawals of the card. Thus, the clip will no longer provide a solid, positive electrical connection with the designation strips.

Some other examples of prior devices for reducing EMI are disclosed in the following U.S. Pat. Nos. 3,469,015 to Warren; 3,573,558 to Babcock; 4,301,494 to Jordan; 4,384,165 to Loving, Jr.; 4,386,388 to Beun; 4,631,641 to Brombal; 4,694,380 to Mallory et al; 4,713,633 to Saito; 4,744,006 to Duffield; 4,758,928 to Wierec; 4,762,966 to Kosanda; 4,780,570 to Chuck; 4,821,145 to Corfits; 4,829,432 to Hershberger et al; 4,872,212 to Roos; 4,903,170 to Finney et al; and 4,970,625 to Belanger et al.

This invention addresses the above mentioned needs in the art, along with other needs which will become apparent from the following disclosure.

SUMMARY OF THE INVENTION

Accordingly, a primary object of the invention is to provide a circuit card assembly adapted to be coupled to a housing for reducing electromagnetic interference emitted from the housing.

Another object of the invention is to provide a circuit card assembly that is relatively inexpensive to manufacture and easy to install.

Another object of the invention is to provide a circuit card assembly which provides a solid, positive ground between a conductive shielding strip along the back face of an insulated faceplate and the housing.

Another object of the invention is to provide a circuit card assembly which grounds a conductive shielding strip on an insulated faceplate upon insertion of the printed circuit card into a housing.

The foregoing objects can basically be attained by a circuit card assembly adapted to be coupled to a housing for reducing electromagnetic interference, the combination comprising: an insulative board having a front edge, a rear edge, a pair of spaced side edges extending longitudinally between the front and rear edges, and electronic circuitry distributed over the insulative board; an insulative faceplate coupled to the insulative board along the front edge; and a shielding assembly, coupled to the insulative board and the faceplate, for reducing electromagnetic interference, the shielding assembly including a conductive strip extending along the insulative faceplate with a contact member for electrically engaging a conductive, grounded portion of the housing upon insertion of the insulative board into the housing, and a ground coupled to the insulative board and electrically coupled to the conductive strip for positively grounding the conductive strip to the housing upon insertion of the insulative board into the housing.

Other objects, advantages and salient features of the invention will become apparent from the following detailed description, which taken in conjunction with the annexed drawings, discloses a preferred embodiment of the invention.

BRIEF DESCRIPTION OF THE DRAWINGS

Referring to the drawings which form part of this original disclosure:

FIG. 3 is an enlarged, partial, left side elevational view of the circuit card assembly partially inserted into the housing of FIGS. 1 and 2;

FIG. 4 is an enlarged, partial, left side elevational view of the circuit card assembly completely inserted into the housing of FIGS. 1–3;

DETAILED DESCRIPTION OF THE INVENTION

Figure 1:
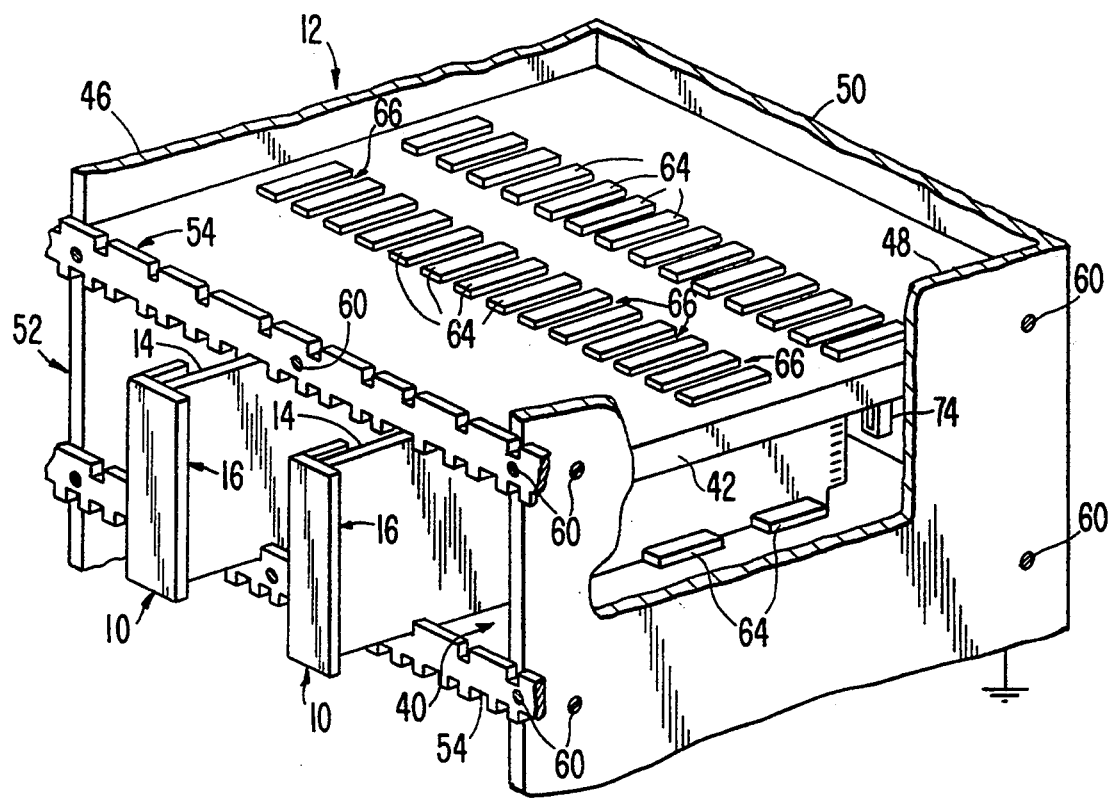
FIG. 1 is a partial, schematic perspective view of a part of a subscriber loop carrier housing with a pair of electromagnetic interference circuit card assemblies partially inserted into the housing in accordance with the present invention.
Figure 2:
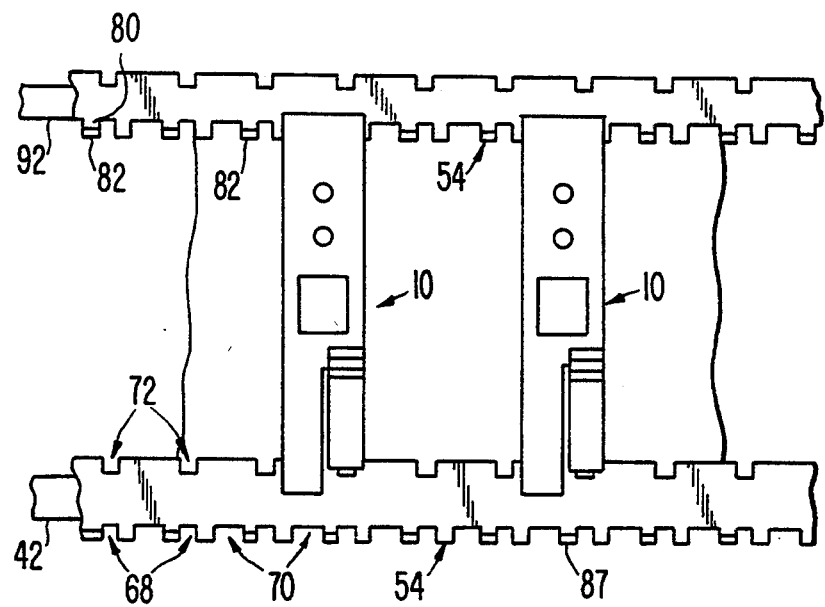
FIG. 2 is an enlarged, partial, schematic front elevational view of the front of the housing and the circuit card assembly of FIG. 1.

Referring initially to FIGS. 1 and 2, a pair of circuit card assemblies 10 partially inserted into housing 12 is schematically illustrated in accordance with the present invention.

Referring now to FIGS. 3 and 4, each of the circuit card assemblies 10 includes an insulative printed circuit board 14, an insulative faceplate 16 rigidly coupled to printed circuit board 14 by screws 18 and 20, and a shielding assembly 22 coupled to printed circuit board 14 and electrically coupled to housing 12 upon insertion of circuit card assembly 10 into housing 12.

Shielding assembly 22 reduces EMI emissions generated by printed circuit board 14 from escaping into the environment. Shielding assembly 22 includes a conductive strip or clip 24 fixedly coupled to faceplate 16, and a grounding path 26 attached to printed circuit board 14. Grounding path 26 is electrically coupled to conductive strip 24 for providing a reliable, solid, positive ground between conductive strip 24 and housing 12 upon insertion of printed circuit board 14 into housing 12. Shielding assembly 22 will be discussed in more detail below.

Housing 12 is illustrated in the form of a subscriber loop carrier housing with a plurality of bays 40 (only one bay shown). Each bay 40 is formed by a pair of vertically spaced horizontal metallic shelves 42, a pair of sheet metal sidewalls 46 and 48, and a sheet metal back panel 50. Subscriber loop carrier housings, such as housing 12, commonly consist of five bays 40. Bay 40 has a substantially rectangular opening 52. Each of the shelves 42 has a designation strip 54 rigidly coupled along its front edge, respectively. Housing 12 is discussed in more detail in U.S. Pat. No. 4,991,062 to Nguyenngoc, the entire disclosure of which is hereby incorporated herein by reference.

Housing 12 is preferably grounded in a conventional manner. The parts of housing 12 are assembled together by a plurality of tap screws 60. In particular, shelves 42 are rigidly coupled to rear back panel 50 and between sidewalls 46 and 48 by tap screws 60. Similarily, a designation strip 54 is coupled to the front side of each shelf 42 by tap screw 60 which pass through the strips into the metal shelves.

Since screws 60 are tap screws, they provide a gap-free electrical interconnection between the metal of the sidewalls 46 and 48, the metal of the rear back panel 50 and the metal of the designation strips 54, through the metal of the screws, to the metal of the shelves. Thus, all of the parts defining the housing 12 are electrically connected together, and grounded in a conventional manner.

Each of the shelves 42 has two transverse rows of ridges 64 projecting vertically from the top and bottom surfaces of each shelf. The rows of ridges 64 are spaced from the front and rear edges of each shelf. The space between adjacent ridges 64 in each of the rows forms a card guideway 66 for guiding and holding the top or bottom edge of a particular printed circuit board 14 in the associated slot of housing 12.

Each of the designation strips 54 has a sequence of alternating notches 68 and 70 spaced along the transverse length of the bottom edges of designation strips 54, and a plurality of notches 72 spaced along the transverse length of the top edges of designation strips 54. Notches 68 are vertically aligned with notches 72 and horizontally aligned with card guideways 66 defined on the top and bottom surfaces of the shelves 42. Notches 68 serve as card entering notches 68 which permit a particular circuit card assembly 10 to be inserted through the notch into guideway 66 in one of the bays 40.

The card entry notches 68 alternate along the length of the designation strips 54 with keyway notches 70 which are adapted to cooperate with "keys" or "key posts" provided on the circuit card assemblies 10 to prevent any particular circuit card from being fully inserted into a bay of the housing at any other location than the one at which the card should be received.

The outer surfaces of the designation strips 54 are preferably coated with an enamel coating or other insulating material 80, except for a plurality of narrow grounded, conductive, contact portions 82 at the bottom edge of the outer surface of each designation strip 54. The enamel free contact portions 82 are primarily metallic portions positioned adjacent each card entry notch 68 for engaging a portion of conductive strip 24 when a circuit card assembly 10 is inserted into housing 12.

If designation strips 54 are made of a non-oxidizing material such as stainless steel, then contact portions 82 can be formed by bare metallic surfaces of the designation strips. Alternatively, the contact portions 82 can be covered with a thin film of material which inhibits oxidation of the underlying metal, such as aluminum. An example of such a coating is the material sold under the trademark IRIDITE by the Witco Corporation, 520 Madison Avenue, New York, N.Y. Such a thin film provides so little impedance to the passage of high frequency electrical current that contact portions 82 can be considered to be metallic surface areas.

As particularly seen in FIGS. 3 and 4, printed circuit board 14 is a conventional rectangular, planar wiring board having electronic circuitry 90 thereon. Electronic circuitry 90 comprises various printed wiring (not shown), various discrete electrical components (not shown), and an array of metallic contact pads 92 electrically coupled to circuitry 90. Pads 92 are adapted to be received in an electrical, edge connector 74 upon full insertion of circuit card assembly 10 into bay 40 of housing 12. The metallic contact pads 92 make electrical contact with their corresponding contacts (not shown) in the edge connector 74 in a conventional matter.

Preferably, printed circuit board 14 has a front edge 94 with faceplate 16 fixed coupled thereto, a rear edge 96 with contact pads 92, and a pair of transverse spaced side edges 98 and 100 extending longitudinally between front and rear edges 94 and 96. A pair of vertically spaced, mounting openings 102 and 104 extend through printed circuit board 14 along front edge 94 for fixedly coupling insulative faceplate 16 thereto via screws 18 and 20. A cutout portion 106 is formed in printed circuit board 14 along front edge 94 between openings 102 and 104. Cutout portion 106 forms a tooth 108 for engaging a plastic latch 110 as discussed below.

Plastic latch 110 is pivotably coupled to the lower front corner of printed circuit board 14 for releasably locking circuit card assembly 10 to housing 12. Plastic latch 110 includes a locking hook 112, a handle portion 114 and a resiliently deflectable pawl arm 116. Plastic latch 110 is preferably a one-piece, unitary, integrally molded member.

In the latched position as illustrated in FIG. 4, latch 110 is rotated fully counterclockwise causing locking hook 112 to extend through an opening 118 in shelf 42 and pawl arm 116 to engage tooth 108 for locking circuit card assembly 10 in housing 12. To disengage circuit card assembly 10 from housing 12, pawl arm 116 and handle portion 114 are squeezed together causing pawl arm 116 to be resiliently deflected upwardly away from tooth 108. Then, latch 110 is rotated clockwise causing locking hook 112 to be retracted from opening 118 to allow circuit card assembly 10 to removed from bay 40 as seen in FIG. 3.

Figure 5:
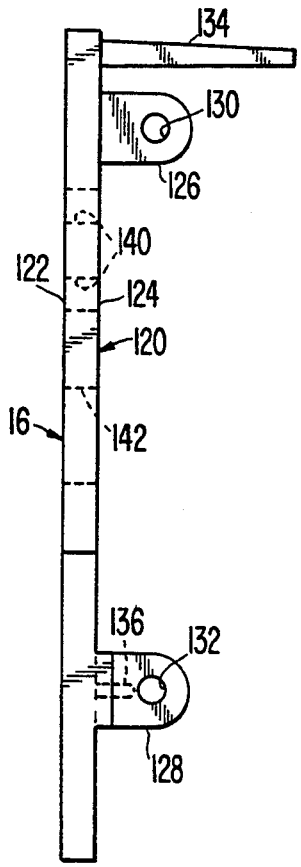
FIG. 5 is an enlarged, right side view of an insulative faceplate in accordance with the present invention.
Figure 6:
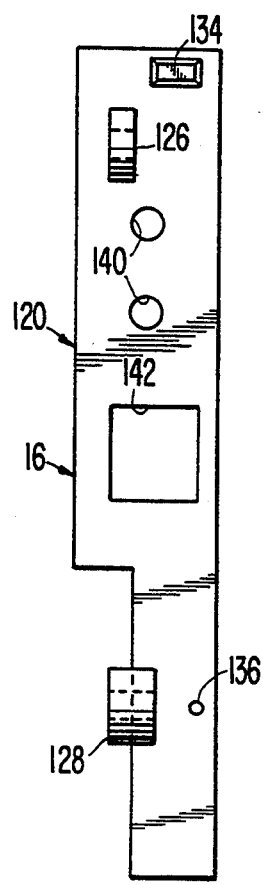
FIG. 6 is an enlarged, rear view of the insulative faceplate of FIG. 5.
Figure 7:
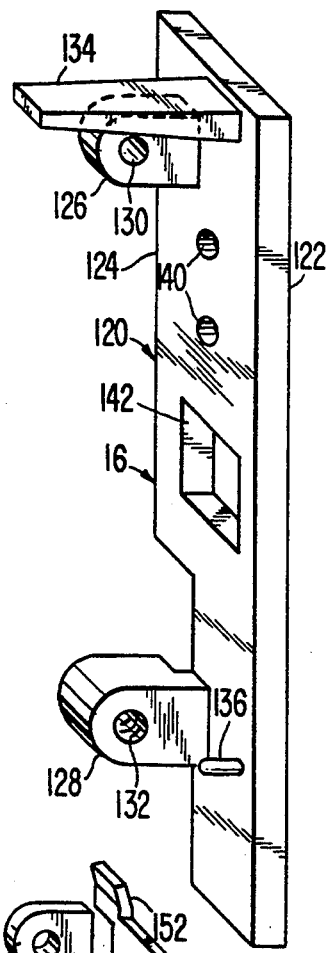
FIG. 7 is an enlarged, perspective view of the insulative faceplate of FIGS. 5 and 6.

Referring now to FIGS. 5–7, insulative faceplate 16 is preferably composed of a synthetic resinous material, which is a unitary one piece, integrally molded structure. Faceplate 16 includes a generally elongated, rectangular, planar body portion 120 with a bottom corner removed, an front surface 122, and a rear surface 124 coupled to the front edge 94 of printed circuit board 14 a pair of vertically spaced mounting lugs 126 and 128 extending outwardly from rear surface 124. Each mounting lug 126 and 128 has a threaded bore 130 and 132, respectively, for receiving mounting screws 18 and 20, respectively, to rigidly couple faceplate 16 to printed circuit board 14.

Rear face 124 also has a key post 134 extending substantially perpendicularly and rearwardly from the top right corner of rear surface 124, and a clip mounting post 136 projecting rearwardly from rear surface 124.

Key post 134 is adapted to fit into a particular keyway notch 70 in an associated designation strip 54. In other words, key post 134 of each circuit card assembly 10 is shaped, sized and positioned on faceplate 16 so that each key post 134 will fit into only one of keyway notches 70, and will not fit into any other of the keyway notches 70 formed on designation strips 54. Thus, key post 134 prevents inadvertent full insertion of a printed circuit card 14 into an incorrect card entry slot 68, where the card does not belong.

Faceplate 16 can also include various openings such as a pair of circular openings 140 for receiving light emitting diodes (not shown) coupled to printed circuit board 14, and a rectangular opening 142 for receiving a test jack (not shown) coupled to printed circuit board 14.

As previously mentioned and as seen in FIGS. 3 and 4, shielding assembly 22 includes conductive shielding strip 24 and grounding path 26 for shielding the faceplate 16 to reduce EMI emissions from escaping from the front opening of housing 12 into the environment.

Figure 8:
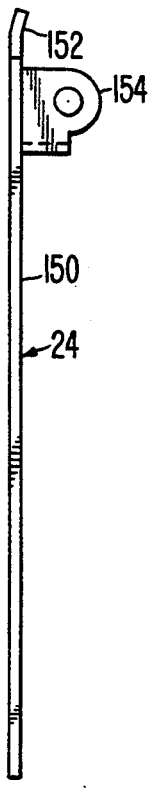
FIG. 8 is an enlarged, right side view of a conductive strip in accordance with the present invention.
Figure 9:
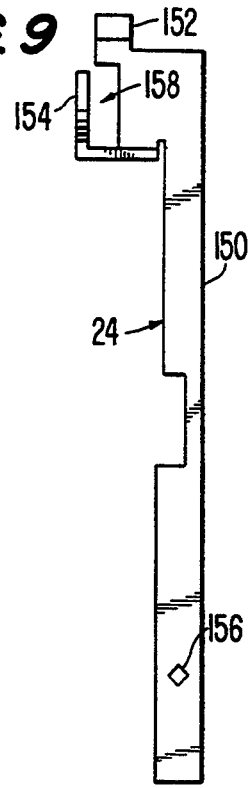
FIG. 9 is an enlarged, rear view of the conductive strip of FIG. 8.
Figure 10:
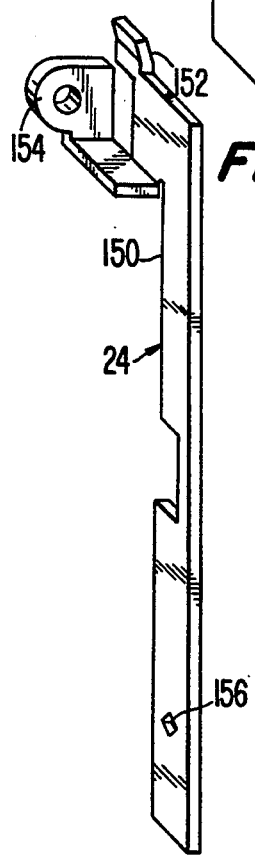
FIG. 10 is an enlarged, perspective view of the conductive strip of FIGS. 8 and 9.

Referring now to FIGS. 8–10, conductive strip 24 is preferably a one-piece, integral, unitary structure formed from an elongated sheet metal strip of approximately 5 to 10 mils thick. The metallic sheet material used to construct conductive strip 24 should be resilient and a good conductor of electricity. For example, the strip can be formed of stainless steel, phosphor bronze, beryllium copper, or any other suitable material. Alternatively, conductive strip 24 could be a metallic paint or coating applied to rear surface 124 of faceplate 16. The metallic coating would have a contact portion which would engage contact portions 82 of the upper designation strip 54.

Conductive strip 24 has an elongated, flat body portion 150 for overlying a substantial portion of rear surface 124 of faceplate 16, a contact portion 152 bent rearwardly to extend away from rear surface 124 of faceplate 16 towards designation strip 54 for engaging contact portions 82 of designation strip 54 upon insertion of printed circuit board 14 into housing 12, a rearwardly extending grounding lug portion 154 for electrically connecting conductive strip 24 to ground path 26, and a square hole 156 in the lower end of body portion 150 for receiving clip mounting post 136 therein.

The diameter or cross-sectional width of clip mounting post 136 is slightly larger than the width of hole 156. Accordingly, conductive strip 24 is coupled faceplate 16 via a press fit. In particular, upon insertion of clip mounting post 136 through hole 156, the edges of hole 156 are slightly deformed and/or the edges of hole 156 dig into clip mounting post 136 for rigidly and fixedly coupling conductive strip 24 to rear surface 124 of faceplate 16.

The upper end of conductive strip 24 is held in place by lug 126 being received in a rectangular lug receiving space 158, which is formed upon bending body portion 150 to form grounding lug portion 154.

AS seen in FIGS. 3 and 4, grounding path 26 is preferably a printed ground wire formed on printed circuit board 14. Grounding path 26 extends along lower side edge 100 between one of the contact pads 92 and a metallic contact area 160 surrounding mounting opening 104 at the front edge 94 of printed circuit board 14, and then extends from contact area 160 along front edge 94 to a metallic contact area 162 surrounding mounting opening 102.

Grounding path 26 is electrically connected to conductive strip 24 by screw 18, which engages and contacts metallic contact area 162 of printed circuit board and grounding lug portion 154 of conductive strip 24. In particular, screw 18 is inserted through opening 102 of printed circuit board 14 and threaded into threaded bore 130 of mounting lug 126 to press grounding lug portion 154 against contact area 160 of printed circuit board 14.

Installation

To install circuit card assembly 10 into housing 12 for providing EMI reduction is accomplished by inserting the printed circuit board 14 into the correct card entry notches 68 and 72, and then locking the printed circuit board 14 in place by plastic latch 110. More specifically, during insertion of printed circuit board 14 into card entry notches 68 and 72, key post 134 will extend into a keyway notch 70. If key post 134 and the key notch 70 correspond, then the printed circuit board 14 will be able to be fully inserted into housing 12. Upon full insertion, contact portion 152 of conductive strip 24 will engage contact portion 82 of designation strip 54. This causes contact portion 152 of conductive strip 24 to be deflected towards rear surface 124 of faceplate 16. Preferably, contact portion 152 of conductive strip 24 is not fully deflected against rear surface 124 of faceplate 16. Also, simultaneously contact pads 92 will engage the contacts in edge connector 74. Thus, the contact pad 92 associated with grounding path 26 will engage one of the contacts of edge connector 74 to provide a solid, positive ground to housing 12. In other words, a firm and reliable ground between conductive strip 24 and housing 12 will always be maintained by grounding path 26, even if contact portion 152 becomes permanently deformed away from designation strip 54.

Upon complete insertion of printed circuit card 14 into bay 40, the latch 110 is then pivoted so that locking hook 112 extends through opening 118 in housing 12 and resiliently deflectable pawl arm 116 engages tooth 108 to lock circuit card assembly 10 in housing 12 as seen in FIG. 4.

While only one embodiment has been chosen to illustrate the invention, it will be understood by those skilled in the art that various changes and modifications can be made herein without departing from the scope of the invention as defined in the appended claims.

What is claimed is:

1. A circuit card assembly adapted to be coupled to a housing for reducing electromagnetic interference, the housing having a front opening and electroconductive means providing a grounded closed-loop electromagnetic wave energy path peripherally surrounding said front opening, said circuit card assembly comprising:

an insulative board having a front edge, a rear edge, a pair of spaced side edges extending longitudinally between said front and rear edges, and electronic circuitry distributed over said insulative board;

an elongated, insulative faceplate coupled to said insulative board along said front edge; and shielding means, coupled to said insulative board and said faceplate, for reducing electromagnetic interference, said shielding means including:

an electrically conductive strip extending along said insulative faceplate and having a first longitudinal end with single contact means for electrically engaging the electroconductive means of the housing upon insertion of said insulative board into the housing and a second longitudinal end without contact means for avoiding electrical engagement with the electroconductive means of the housing upon insertion of said insulative board into the housing, and grounding means, coupled to said insulative board and electrically coupled to said conductive strip, for positively grounding said conductive strip other than to the electroconductive means of the housing upon insertion of said insulative board into the housing.

2. A circuit card assembly according to claim 1, wherein
said conductive strip is a thin metallic strip.

3. A circuit card assembly according to claim 2, wherein
said faceplate includes means for fixedly coupling said conductive strip thereto.

4. A circuit card assembly according to claim 3, wherein
said conductive strip has a mounting hole with a predetermined width extending therethrough, and said means for fixedly coupling includes a post extending outwardly from said faceplate with a cross-sectional width slightly larger than the width of said mounting hole.

5. A circuit card assembly according to claim 1, wherein
said insulative board has a plurality of electrical contact pads electrically coupled to said electronic circuitry and positioned along one of said edges of said insulative board for engaging an edge connector mounted on the housing; and
said grounding means includes a printed grounding path and a contact pad printed on said insulative board with said contact pad of said grounding means being adapted to engage the edge connector on the housing substantially simultaneously with said contact pads of said electronic circuitry upon insertion of said insulative board into the housing.

6. A circuit card assembly according to claim 5, wherein
said conductive strip and said contact means are formed by a thin metallic strip with a substantially flat body portion overlying a rear surface of said faceplate and a resilient, blade, spring contact extending outwardly from said body portion.

7. A circuit card assembly according to claim 6, wherein
said body portion of said conductive strip also includes an outwardly extending metallic grounding lug portion with an opening therethrough, and said grounding path includes a contact area surrounding a first mounting opening in said board and a first screw extending through said openings in said grounding lug portion and said board for electrically coupling said grounding path to said conductive strip and for coupling said faceplate to said board.

8. A circuit card assembly according to claim 7, wherein
said faceplate includes a first mounting lug with a first threaded opening for threadedly receiving said first screw such that said grounding lug portion of said conductive strip overlies said first mounting lug.

9. A circuit card assembly according to claim 8, wherein
said faceplate further includes a second mounting lug with a second threaded opening spaced vertically from said first mounting lug, and said insulative board further includes a second mounting opening for receiving a second screw therethrough, said second screw being threadedly received in said second threaded opening in said second mounting lug to secure said faceplate to said board.

10. A circuit card according to claim 1, wherein
said grounding means extends along said insulative board without direct electrical connection to said electronic circuitry.

11. An electrical assembly, comprising:
a grounded housing having a pair of sidewalls, a rear wall coupled to said sidewalls, a pair of vertically spaced horizontal shelves coupled to said sidewalls and said rear wall to form a bay with a front opening, electroconductive means providing a grounded closed-loop electromagnetic wave energy path peripherally surrounding said front opening, and at least one electrical connector coupled to said rear wall;

at least one elongated, insulative board having a front edge, a rear edge, a pair of spaced side edges extending longitudinally between said front and rear edges, and electronic circuitry distributed over said insulative board, said insulative board being removeably received in said housing;

an insulative faceplate coupled to said insulative board along said front edge; and shielding means, coupled to said insulative board and said faceplate, for reducing electromagnetic interference, said shielding means including:

an electrically conductive strip extending along said insulative faceplate and having a first longitudinal end with contact means for electrically engaging a first portion of said electroconductive means of said housing upon insertion of said insulative board into said housing and a second longitudinal end without contact means for avoiding electrical engagement between said second end of said conductive strip and a second portion of said electroconductive means of said housing upon insertion of said insulative board into said housing, and grounding means, coupled to said insulative board and electrically coupled to said conductive strip, for positively grounding said conductive strip other than to said electroconductive means of said housing upon insertion of said insulative board into said housing.

12. An electrical assembly according to claim 11, wherein
said conductive strip is a thin metallic strip.

13. An electrical assembly according to claim 12, wherein
said faceplate includes means for fixedly coupling said conductive strip thereto.

14. An electrical assembly according to claim 13, wherein
said conductive strip has a mounting hole with a predetermined width extending therethrough, and said means for fixedly coupling includes a post extending outwardly from said faceplate with a cross-sectional width slightly larger than the width of said mounting hole.

15. An electrical assembly according to claim 11, wherein
said insulative board has a plurality of electrical contact pads electrically coupled to said electronic circuitry and positioned along said rear edge of said insulative board for engaging said electrical connector of said housing; and
said grounding means includes a printed grounding path and a contact pad printed on said insulative board with said contact pad of said grounding means being adapted to engage said electrical connector on said housing substantially simultaneously with said contact pads of said electronic circuitry upon insertion of said insulative board into said housing.

16. An electrical assembly according to claim 15, wherein
said conductive strip and said contact means are formed by a thin metallic strip with a substantially flat body portion overlying a rear surface of said faceplate and a resilient, blade, spring contact extending outwardly from said body portion.

17. An electrical assembly according to claim 16, wherein
said body portion of said conductive strip also includes an outwardly extending metallic grounding lug portion with an opening therethrough, and said grounding path includes a contact area surrounding a first mounting opening in said board and a first screw extending through said openings in said grounding lug portion and said board for electrically coupling said grounding path to said conductive strip and for coupling said faceplate to said board.

18. An electrical assembly according to claim 17, wherein
said faceplate includes a first mounting lug with a first threaded opening for threadedly receiving said first screw such that said grounding lug portion of said conductive strip overlies said first mounting lug.

19. An electrical assembly according to claim 11, wherein
said grounding means includes a contact pad releasably coupled to said electrical connector of said housing for grounding said conductive strip to said housing.

20. An electrical assembly according to claim 11, wherein
said grounding means extends along said insulative board without direct electrical connection to said electronic circuitry.

21. A circuit card assembly adapted to be coupled to a housing for reducing electromagnetic interference, the housing having a front opening and electroconductive means providing a grounded closed-loop electromagnetic wave energy path peripherally surrounding said opening, said circuit card assembly comprising:

an insulative board having a front edge, a rear edge, a pair of spaced side edges extending longitudinally between said front and rear edges, and electronic circuitry distributed over said insulative board with a plurality of electrical contact pads electrically coupled to said electronic circuitry and positioned along one of said edges of said insulative board for engaging an edge connector mounted on the housing;

an insulative faceplate coupled to said insulative board along said front edge; and shielding means, coupled to said insulative board and said faceplate, for reducing electromagnetic interference, said shielding means including:

an electrically conductive strip having first and second ends, said strip extending along said insulative faceplate with contact means at said first end of said strip but not at said second end of said strip for electrically engaging the electroconductive means of the housing upon insertion of said insulative board into the housing, and grounding means, coupled to said insulative board and electrically coupled to said conductive strip, for positively grounding said conductive strip to the housing upon insertion of said insulative board into the housing, said grounding means having a printed grounding path and a contact pad printed on said insulative board with said contact pad of said grounding means being adapted to engage the edge connector on the housing substantially simultaneously with said contact pads of said electronic circuitry upon insertion of said insulative board into the housing.

22. A circuit card assembly according to claim 21, wherein
said conductive strip is a thin metallic strip.

23. A circuit card assembly according to claim 21, wherein said conductive strip and said contact means are formed by a thin metallic strip with a substantially flat body portion overlying a rear surface of said faceplate and a resilient, blade, spring contact extending outwardly from said body portion.

24. An electrical assembly, comprising:

a grounded housing having a pair of sidewalls, a rear wall coupled to said sidewalls, a pair of vertically spaced horizontal shelves coupled to said sidewalls and said rear wall to form a bay with a front opening, electroconductive means providing a grounded closed-loop electromagnetic wave energy path peripherally surrounding said front opening, and at least on electrical edge connector coupled to said rear wall;

at least one insulative board having a front edge, a rear edge, a pair of spaced side edges extending longitudinally between said front and rear edges, and electronic circuitry distributed over said insulative board with a plurality of electrical contact pads electrically coupled to said electronic circuitry and positioned along said rear edge of said insulative board for engaging said edge connector of said housing, said insulative board being removeably received in said housing;

an insulative faceplate coupled to said insulative board along said front edge; and shielding means, coupled to said insulative board and said faceplate, for reducing electromagnetic interference, said shielding means including:

an electrically conductive strip having first and second ends, said strip extending along said insulative faceplate with contact means at said first end of said strip but not at said second end of said strip for electrically engaging the electroconductive means of said housing upon insertion of said insulative board into said housing, and grounding means, coupled to said insulative board and electrically coupled to said conductive strip, for positively grounding said conductive strip to said housing upon insertion of said insulative board into said housing, said grounding having a printed grounding path and a contact pad printed on said insulative board with said contact pad of said grounding means being adapted to engage said edge connector on said housing substantially simultaneously with said contact pads of said electronic circuitry upon insertion of said insulative board into said housing.

25. An electrical assembly according to claim 24, wherein said conductive strip is a thin metallic strip.

26. An electrical assembly according to claim 25, wherein said faceplate includes means for fixedly coupling said conductive strip thereto.

27. An electrical assembly according to claim 26, wherein said conductive strip has a mounting hole with a predetermined width extending therethrough, and said means for fixedly coupling includes a post extending outwardly from said faceplate with a cross-sectional width slightly larger than the width of said mounting hole.

* * * * *